(12) United States Patent
Block et al.

(10) Patent No.: US 9,532,454 B2
(45) Date of Patent: Dec. 27, 2016

(54) MONOLITHIC CERAMIC COMPONENT AND PRODUCTION METHOD

(75) Inventors: Christian Block, Stainz (AT); Pavol Dudesek, Bad Gams (AT); Thomas Feichtinger, Graz (AT); Christian Hoffmann, Deutschlandsberg (AT); Guenter Pudmich, Köflach (AT)

(73) Assignee: EPCOS AG, Munich (DE)

( * ) Notice: Subject to any disclaimer, the term of this patent is extended or adjusted under 35 U.S.C. 154(b) by 1754 days.

(21) Appl. No.: 12/159,809

(22) PCT Filed: Jan. 3, 2007

(86) PCT No.: PCT/DE2007/000002
§ 371 (c)(1),
(2), (4) Date: Sep. 29, 2008

(87) PCT Pub. No.: WO2007/076849
PCT Pub. Date: Jul. 12, 2007

(65) Prior Publication Data
US 2009/0035560 A1 Feb. 5, 2009

(30) Foreign Application Priority Data
Jan. 5, 2006 (DE) .................. 10 2006 000 935

(51) Int. Cl.
  *B32B 18/00* (2006.01)
  *C04B 35/46* (2006.01)
  (Continued)

(52) U.S. Cl.
  CPC ............... *H05K 1/162* (2013.01); *B32B 18/00* (2013.01); *H01C 1/14* (2013.01); *H01C 7/18* (2013.01);
  (Continued)

(58) Field of Classification Search
  None
  See application file for complete search history.

(56) References Cited

U.S. PATENT DOCUMENTS 4,554,197 A * 11/1985 Chyung et al. ............... 428/113
5,153,152 A * 10/1992 Dawes et al. ................ 501/95.2
(Continued)

FOREIGN PATENT DOCUMENTS

DE     19817481     10/1999
DE     101 45 363     4/2003
(Continued)

OTHER PUBLICATIONS

English translation of Written Opinion for PCT/DE2007/000002.
(Continued)

*Primary Examiner* — Ronak Patel
(74) *Attorney, Agent, or Firm* — Fish & Richardson P.C.

(57) ABSTRACT

A film stack made from compacted green films and capable of being sintered to form a ceramic component with monolithic multi-layer structure is disclosed. The film stack includes a functional layer comprising a green film comprising a functional ceramic and a tension layer comprising a green film comprising a dielectric material. The tension layer is directly adjacent to the functional layer in the multi-layer structure. The multilayer structure also includes a first metallization plane and a second metallization plane. The functional layer is between the first metallization plane and the second metallization plane.

18 Claims, 4 Drawing Sheets

(51) Int. Cl.
| | |
|---|---|
| B32B 17/00 | (2006.01) |
| B32B 5/00 | (2006.01) |
| C03C 3/00 | (2006.01) |
| H05K 1/16 | (2006.01) |
| H01C 1/14 | (2006.01) |
| H01C 7/18 | (2006.01) |
| H01G 4/232 | (2006.01) |
| H01G 4/30 | (2006.01) |
| H01G 4/40 | (2006.01) |
| H01L 21/48 | (2006.01) |
| H01L 23/498 | (2006.01) |
| H01L 23/552 | (2006.01) |
| H01F 10/20 | (2006.01) |
| H01F 17/00 | (2006.01) |
| H01L 25/16 | (2006.01) |
| H03H 1/00 | (2006.01) |
| H05K 1/03 | (2006.01) |
| H05K 3/46 | (2006.01) |
| H01F 10/26 | (2006.01) |

(52) U.S. Cl.
CPC .............. *H01G 4/232* (2013.01); *H01G 4/30* (2013.01); *H01G 4/40* (2013.01); *H01L 21/4857* (2013.01); *H01L 23/49822* (2013.01); *H01L 23/552* (2013.01); *C04B 2235/6562* (2013.01); *C04B 2235/6565* (2013.01); *C04B 2235/6567* (2013.01); *C04B 2237/341* (2013.01); *C04B 2237/343* (2013.01); *C04B 2237/346* (2013.01); *C04B 2237/348* (2013.01); *C04B 2237/366* (2013.01); *C04B 2237/564* (2013.01); *C04B 2237/62* (2013.01); *C04B 2237/68* (2013.01); *C04B 2237/702* (2013.01); *C04B 2237/704* (2013.01); *H01F 10/20* (2013.01); *H01F 10/265* (2013.01); *H01F 17/0013* (2013.01); *H01L 25/16* (2013.01); *H01L 2924/0002* (2013.01); *H01L 2924/09701* (2013.01); *H01L 2924/3011* (2013.01); *H03H 2001/0085* (2013.01); *H05K 1/0306* (2013.01); *H05K 1/165* (2013.01); *H05K 1/167* (2013.01); *H05K 3/4611* (2013.01); *H05K 3/4629* (2013.01); *H05K 3/4688* (2013.01); *Y10T 428/265* (2015.01)

(56) References Cited

U.S. PATENT DOCUMENTS

| | | | |
|---|---|---|---|
| 5,216,207 | A * | 6/1993 | Prabhu et al. ............... 174/256 |
| 5,750,272 | A * | 5/1998 | Jardine ........................ 428/686 |
| 6,579,392 | B1 | 6/2003 | Kameda et al. |
| 7,160,406 | B2 | 1/2007 | Hoffmann et al. |
| 2002/0135274 | A1* | 9/2002 | Wajima et al. ............... 310/348 |
| 2002/0189742 | A1* | 12/2002 | Moriya et al. ............. 156/89.11 |
| 2004/0144476 | A1 | 7/2004 | Fukuta et al. |
| 2004/0211506 | A1 | 10/2004 | Wang et al. |
| 2005/0214517 | A1* | 9/2005 | Sugimoto et al. ............ 428/209 |

FOREIGN PATENT DOCUMENTS

| | | |
|---|---|---|
| DE | 103 09 689 | 9/2004 |
| EP | 1 369 402 | 12/2003 |
| EP | 1 435 651 | 7/2004 |
| EP | 1 453 091 | 12/2006 |
| JP | 06-097656 | 4/1994 |
| JP | 10-308584 | 11/1998 |
| JP | 2001-119144 | 4/2001 |
| JP | 2001-177014 | 6/2001 |
| JP | 2001-244140 | 7/2001 |
| JP | 2002-104880 | 4/2002 |
| JP | 2002-520878 | 7/2002 |
| JP | 2002-368420 | 12/2002 |
| JP | 2004-214573 | 7/2004 |
| JP | 2005-501795 | 1/2005 |
| WO | WO00/04577 | 1/2000 |

OTHER PUBLICATIONS

International Search Report for PCT/DE2007/000002.
Written Opinion for PCT/DE2007/000002.
Japanese Patent Office, Notification of Reasons for Refusal (type I office action), in Japanese Patent Application No. 2008-548927, mailed Aug. 24, 2011, 4 pages.
Examination report for corresponding application JP 2012-228312 dated Mar. 10, 2014, 4 pages.
Japanese Examination Report for corresponding application 2012-228312, dated Aug. 5, 2013, 10 pages.

\* cited by examiner

MONOLITHIC CERAMIC COMPONENT AND PRODUCTION METHOD

CROSS REFERENCE TO RELATED APPLICATIONS

Pursuant to 35 USC §120, this application claims the benefit PCT/DE2007/000002 filed Jan. 3, 2007 which claims the benefit of German Patent Application No. 102006000935.5 filed Jan. 5, 2006. Each of these applications is incorporated by reference in its entirety.

TECHNICAL FIELD

The invention relates to a ceramic component with a multi-layer structure, which exhibits low lateral shrinkage during sintering.

BACKGROUND

Ceramic multi-layer superstructures, in particular, those with electrically conductive structures implemented in metallization layers, can be used as dielectric carrier substrates with an integrated wiring structure. It is also possible to use functional ceramics in a ceramic multi-layer structure, so that component functions can be integrated into the multi-layer structure in connection with electrode structures. It is also possible to realize complete electrical circuits in the form of components integrated into a multi-layer structure.

The overall objective in the development of electrical components is to create highly miniaturized structures and components that work reliably and that can be easily produced. One problem with ceramic components results from the fact that ceramic green material and particularly ceramic green films compress during sintering and therefore exhibit shrinkage, which can equal, e.g., 20 to 50 volume percent and more. Due to the volume shrinkage, the geometrical relationships of all of the structures realized in and on the ceramic and particularly those of electrically conductive structures change. One objective is therefore to configure the volume shrinkage during sintering in such a way that it takes place essentially in a dimension vertical to the plane of the multi-layer structure and that, within the layer plane, the structures given in the green film are maintained without excessive changes after sintering.

From DE 10145363 A1, a multi-layer ceramic is known in which component functions are implemented. A lateral distortion of the multi-layer structure is here prevented by two measures. An increased proportion of sintering agent is added to the uppermost layer of the multi-layer structure and the multi-layer structure is then deformed with a constraining layer that exhibits no structural conversion at the sintering temperatures used for the component and therefore reduces the distortion of the multi-layer structure associated with the constraining layer. The elevated component of sintering agents in the uppermost layer of the multi-layer structure provides good adhesion of the constraining layer in that the sintering agent diffuses into the adjacent layers. This has the disadvantage, however, that a) the constraining layer must be removed after sintering, b) the sintering agent also diffuses into the functional ceramic, changes the composition of this ceramic, and influences the electrical operation in a disadvantageous and an at least uncontrollable way, and also that c) external metal contacts must still be deposited at a later time or are contaminated at least with the residues of the constraining layer.

From EP 1453091 A1, a dielectric ceramic substrate with a multi-layer structure is known which comprises a combination from a glass-ceramic layer in the interior of the multi-layer structure and an external glass layer remaining in the glass state.

SUMMARY

One problem of the present invention is to specify a monolithic ceramic component in which the lateral shrinkage within the planes of the layers is minimized and whose production is simplified relative to known methods.

This problem is solved according to the invention by a component with the features of claim 1. Advantageous implementations of the invention, as well as a method for producing the component, are to be taken from the other claims.

A ceramic component with a monolithic multi-layer structure is proposed, which is constructed from at least one functional layer comprising a functional ceramic and at least one tension layer made from a dielectric recrystallized material. Furthermore, in the ceramic component, at least two metallization layers are provided, between which a functional layer is arranged. The metallization layers comprise electrically conductive structures, which realize, together with the functional layer, a component function.

The material of the tension layer is recrystallized, wherein the associated phase transition takes place at a temperature below the sintering temperature of the functional ceramic. The recrystallized dielectric material of the tension layer is further selected so that after recrystallization it remains in the solid, crystalline state above the sintering temperature of the functional layer.

A component generated from a stack of green films through sintering exhibits only very low lateral shrinkage of less than two percent and in the embodiments even less than 0.1 percent during sintering. In this way, a component can be obtained which has a high-precision lateral structure that exhibits reproducible component characteristics as a function of the accuracy of this structure and that has, for example, defined contact surfaces for connecting to additional components or for mounting on circuit boards by means of solder. The component has a dense ceramic structure with low residual porosity, whose layers are connected to each other monolithically. The tension layer has dielectric properties and can be used as an outer layer of the multi-layer structure as an insulation layer.

The low lateral shrinkage during sintering concerns the effect of the tension layer, which maintains a fixed crystalline structure above the sintering temperature of the functional ceramic after the recrystallization and the associated phase change during further heating. During the sintering of the functional ceramic, the multi-layer structure is stabilized by the tension layer in the x, y directions. In contrast, the unsintered functional layer stabilizes the multi-layer structure in the recrystallization of the tension layer.

A monolithic ceramic component with a multi-layer structure and the specified low lateral shrinkage during sintering can be realized with tension layers starting at a thickness of approximately 15 µm. For a thickness of 30 µm, the tension layer has a strength between 5 and 10 kPa, determined by standard methods, which is sufficient for tensioning the functional layer during the sintering in the lateral direction through friction forces and for preventing distortion. With the relatively low layer thickness of the tension layer, a ceramic component of minimal height can be realized, whose layer thickness is not determined by this additional tension layer. In comparison with known LTCC multi-layer ceramics with low shrinkage, which can be obtained only with a constraining layer that is unsinterable and that therefore remains in the porous state, this has the additional advantage that the tension layer can take over insulating tasks, can be used as an intermediate layer, and thus can remain on the component, while the known constraining layer must be removed at a later time.

The component function is obtained through at least two metallization layers with a functional layer arranged inbetween. Here, the electrically conductive structures arranged in the metallization plane can be in direct contact with the functional layer, so that components can be realized for which a current flow through the functional layer is provided. However, it is also possible to arrange a tension layer between a metallization plane and a functional layer, wherein ceramic components can be realized without a current flow through the functional layer. However, it is advantageous to provide, within one functional layer, several metallization planes with electrically conductive structures arranged therein, which can form a plurality of electrode surfaces for the multi-layer ceramic component.

On a surface, the component has electrical contact surfaces, each of which can be connected to at least one metallization plane. The connection to contact surfaces and electrically conductive structures arranged in other metallization planes can be realized by means of via contacts each through one or more layers of the multi-layer structure. Here, different metallization planes can also be connected to each other within the functional layer and can be optionally connected to the contact surfaces.

However, it is also possible to connect only metal surfaces on the outside to contacts, while inner metallization planes are only capacitively, and not galvanically, coupled to these contacts or the metal surfaces lying on the outside.

The two or more contacts of the ceramic component can be arranged together on one of the outer surfaces of the component or on different outer surfaces.

For the tension layer, any dielectric material can be used, which, starting from a ceramic green body, undergoes recrystallization during the first sintering and, in this way, transitions with a phase change into a solid and also stable state after cooling with a higher fusion point. In this connection, a compaction (sintering), which thereby produces the recrystallized phase with the increased fusion point, is also understood as a phase change. Suitable phases for this are, in principle, all ceramic phases that have no or only insignificant reactions or diffusions with the functional ceramic at the second sintering temperature. In one advantageous embodiment, the recrystallized material is a glass ceramic.

The ceramic component can have at least one component function, wherein the function is selected from resistor, capacitor, inductor, varistor, or thermistor. Such a function is obtained in connection with a corresponding material for the functional ceramic, which is then selected accordingly from resistor material, capacitor ceramic, ferrite, varistor material, PTC or NTC ceramic.

Theoretically, each of these component functions can be realized with only two metallization planes and the electrically conductive structures arranged therein. However, the component function is advantageously realized with a plurality of metallization planes. For voltage-, current-, and temperature-dependent resistors, the current path can be better modeled than is possible with only two metallization planes. In addition, with a multi-layer ceramic with several metallization planes, the distance between individual metallization planes, and thus the distance between electrodes of different poles, can be reduced, without negatively affecting the current capacity of the underlying ceramic body with the variable resistance.

If a capacitive component type is realized, then the capacitance of the capacitor can be increased with each additional metallization plane. If an inductive component type is realized, then windings of a spiral-shaped conductor structure, e.g., extending through the functional layer, can be realized in each metallization layer, whereby the inductance can be increased with the number of windings and therefore with the number of metallization planes.

A ceramic component according to the invention can also have more than one component function, however. For this purpose, the component advantageously has at least two different functional layers, which are selected for different component types. The different functional layers can be arranged one directly above the other or can be separated from each other by a tension layer. The different component functions or the realized component can be electrically connected to each other.

However, it is also possible to connect each sub-component with a component function individually via corresponding electrical contact surfaces on an outer surface of the multi-layer structure, in particular, on the bottom side of the multi-layer structure, and then to interconnect the contact surfaces externally. However, the component can also have a wiring structure with which the interconnection of several identical or different components is achieved within the ceramic multi-layer structure.

The ceramic component can have an alternating sequence of tension layers and functional layers, wherein the maximum number of tension and functional layers can be limited only by a maximally allowable overall height. Advantageously, such an alternating structure is shaped symmetrically with respect to the layer sequence and layer thickness of the individual layers. A symmetrical construction has the advantage that stresses that inevitably appear during recrystallization and sintering of the tension layer and functional layer can be optimally compensated. With a symmetrical structure, a low-distortion or flat component can be obtained with a multi-layer structure in an especially simple way.

In addition to the tension and functional layers and the metallization planes, the ceramic component can comprise additional layers. Thus, for example, additional passivation layers can be provided, particularly on the top and bottom sides of the multi-layer structure. It is also possible to arrange additional electrically insulating intermediate layers in the multi-layer structure, which then can be constructed from different materials or with a smaller layer thickness than the tension layers. Advantageously, it is also possible to provide on a surface of the multi-layer structure, a resistance layer for which a current path is provided in the lateral direction, and thus within the layer plane, wherein the resistance layer is optionally structured and two electrical contact surfaces on the top side of the multi-layer structure can be connected to each other. In particular, resistance layers can also still be covered with a passivation layer. Such layers are advantageously deposited with thin-film or thick-film processes, but advantageously with a thick-film process, such as screen printing, e.g.

The properties of the tension layer are specifically defined by the crystal structure of the material used for this purpose. The tension layer can therefore comprise domains from mineral oxides crystallizing out in the fixed lattice and other compounds, wherein these domains can be embedded into a matrix made from a varying but advantageously regular crystal lattice. Such domains with insulated phases can comprise materials, such as aluminum oxide $Al_2O_3$, titanium oxide $TiO_2$, or zirconium oxide $ZrO_2$. In addition to the oxides, nitrides and other crystalline materials are also suitable. It is possible, for example, to provide crystalline domains made from AlN, $Mg_2SiO_4$, $SiO_2$, $Zn_2SiO_4$, $ZrSiO_4$, celsian, mollite, spodumen, titanates, zirconates, and mixtures of these materials.

For the matrix, any ceramic material forming crystal domains is suitable, but especially glass powder forming glass ceramics. These can be selected from alkali borosilicate glasses $Me_2O$—$B_2O_3$—$SiO_2$, alumoborosilicate glasses $M''O$—$Al_2O_3$—$B_2O_3$—$SiO_2$, alumosilicate glasses $Me''O$—$Al_2O_3SiO_2$, lanthanum borate titanate glasses $(Me''O)$—$La_2O_3B_2O_3TiO_2$, alkaline earth lanthanum borate glasses $(Me_2'O)$-$Me''O$—$La_2O_3$—$B_2O_3$, and lead-bearing alkaline earth glasses, such as $SiO_2$—$PbO$-$Me''O$, wherein $Me'$=Li, Na, K, and mixtures of these materials, as well as $Me''$=Mg, Ca, Sr, Ba, Zn. Mixtures of these named glasses and any other recrystallized glass are also suitable.

Such glass ceramics can be realized with suitable phase-change temperatures. Functional ceramics can then be selected essentially without an upper limit on the sintering temperature, wherein advantageously a spacing of the sintering temperature from the phase-change temperature of at least 50 kelvin is maintained. Most functional ceramics have sintering temperatures greater than 1000° kelvin, and thus can be installed without problem into the ceramic component according to the invention.

The ceramic component can be used as a discrete component or as a circuit arrangement of several, optionally different components and as such can be mounted in any other circuits on circuit boards or other substrates and furthermore interconnected. However, due to the mechanically stable monolithic structure, it is also possible to use the ceramic component itself as a substrate for additional components. It is possible, e.g., to provide, on the bottom side of the multi-layer structure, solderable contacts for the outer contacting of the component; to provide, on a different surface, advantageously on the top side of the multi-layer structure, in contrast, electrical contact surfaces; and to connect the component by means of these contact surfaces to at least one other component. The connection can be performed using flip-chip, wire-bonding, or SMD technology. The additional component is advantageously a discrete component, in particular, an active semiconductor component or a passive electric component.

The mechanical and electrical connection of the ceramic component to additional components then has advantages, particularly when the total structural height of the interconnected components remains below a required maximum structural height. The combination obtained in this way requires less area on a printed-circuit board or another substrate, is easier to handle due to the integrated construction, and allows low-impedance connections of the two components, which advantageously belong to different component types.

In the following, the invention will be explained in more detail with reference to embodiments and the associated figures. The figures are used mainly for illustrating the invention and are constructed only schematically and are not to scale.

DESCRIPTION OF THE DRAWINGS

Shown are.

DETAILED DESCRIPTION

Figure 1A:
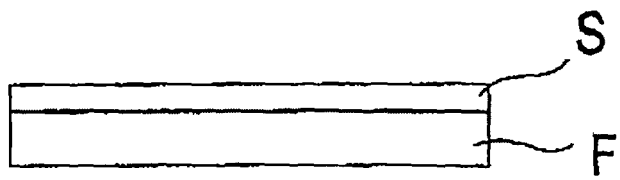
FIG. 1, a ceramic monolithic component with an asymmetrical multi-layer structure in schematic cross section,
FIG. 2, a monolithic ceramic multi-layer component with an asymmetrical structure in schematic cross section,
FIG. 3, a ceramic component constructed as an ESD/EMI filter in schematic cross section,
FIG. 4, another ESD/EMI filter in schematic cross section,
FIG. 5, different processing steps for the production of the ceramic component with reference to schematic cross sections.

FIG. 1a shows a simple embodiment of the invention. It comprises two monolithic interconnected layers, namely, a functional layer F and a tension layer S. In two metallization planes (not shown in the figure), electrically conductive structures are realized that produce, together with the functional layer F, a component function. The metallization planes can be arranged on both outer surfaces (shown at the top and bottom in the figure) of the two-layer structure. It is also possible to provide the metallization planes on both sides (top and bottom) adjacent to the functional layer F and another optionally on the top side of the two-layer structure.

Figure 1B:
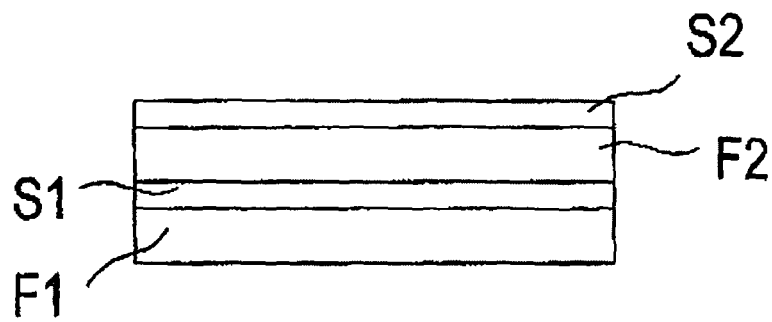

The two-layer structure can be expanded through the alternating arrangement of additional function and tension layers F, S. FIG. 1b shows, for example, another multi-layer structure in which two tension layers S and two functional layers F are arranged in an alternating way one above the other and are connected to each other monolithically. FIGS. 1a and 1b each represent asymmetrical multi-layer superstructures.

Figure 2A:
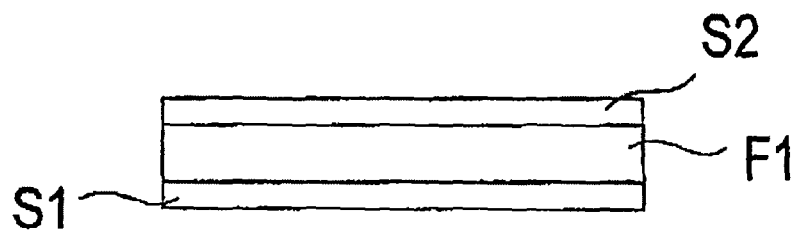
Figure 2B:
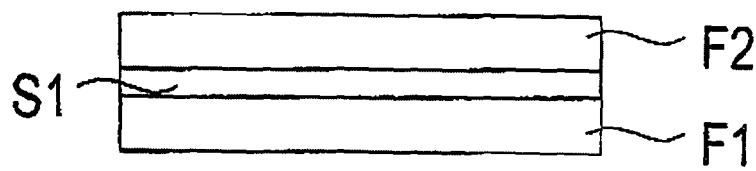
Figure 2C:
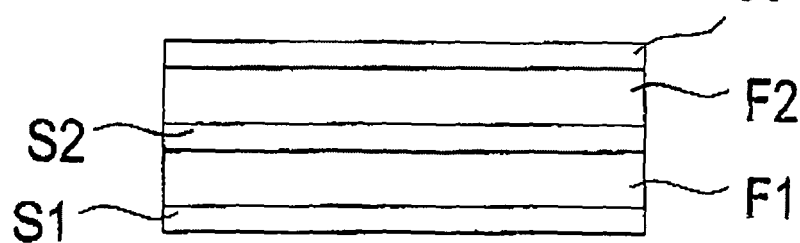

FIG. 2 shows a series of possible symmetrical multi-layer superstructures in which the symmetry specifically relates to the layer sequence in the stack direction and advantageously also to their layer thicknesses. Such multi-layer arrangements are compensated and therefore have low distortion after sintering with respect to possible deformation.

Both the asymmetrical superstructures according to FIG. 1 and the symmetrical superstructures according to FIG. 2 can also be advantageously arranged alternatingly with single or multiple layers. Here, it is possible that the layers pointing outwardly (up or down) in the stack are each selected from the same type and from functional or tension layers. It is also possible, however, to assign the two layers pointing outward to different types.

FIG. 3 shows a first concrete embodiment of a ceramic component. Shown is a filter against ESD/EMI interference (electrostatic discharge/electromagnetic interference), which is assembled from R and C elements in a π arrangement.

Figure 3A:
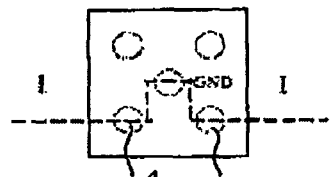
Figure 3B:
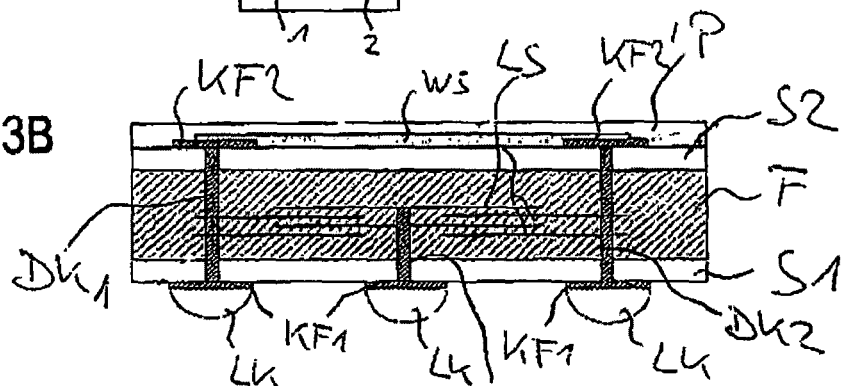
Figure 3C:
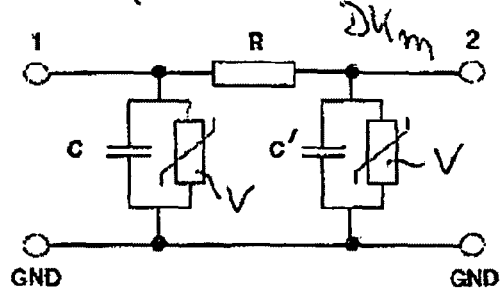

FIG. 3c shows an equivalent circuit diagram of this n-filter, which is connected as a protective component between two contacts 1 and 2. The two connections are bridged with a high-impedance resistor R, with which electrostatic charges with low time constants can be harmlessly discharged. Before and after the resistor, the circuit is bridged by a parallel branch with a voltage-dependent resistor connected to ground. The resistor has a purely capacitive action at low voltages. High voltage or high-frequency interference on one of the two terminals 1 or 2 is harmlessly discharged to ground via the varistor. FIG. 3a shows such a filter from the bottom side, on which are arranged the electrical contact surfaces or the solder bumps on these surfaces. The filter can have, for example, 5 terminals as shown here and can be connected in two lines or between two pairs of terminals. The middle terminal is provided for the ground connection.

FIG. 3b shows the component in schematic cross section. It is built from two tension layers S1, S2, between which there is a functional layer F. The functional layer F in turn comprises several ceramic layers, between which metallization planes are arranged. On the bottom side, the component has contact surfaces KF1. On the top side, corresponding contact surfaces KF2 are arranged. Each via contact connects a pair of contact surfaces KF1 and KF2 arranged on opposite surfaces, wherein the via contacts are advantageously guided vertically through all of the ceramic layers of the component.

Another via contact shown in the middle in the figure is connected to a bottom contact surface KF1, but reaches only partially through the functional layer F. Conductive structures LS arranged in the metallization planes are connected to each via contact DK. The conductive structures LS connected to a via contact DK are separated galvanically from the conductive structures that are assigned to other via contacts. For example, the conductive structures that are assigned to the via contact DK1 shown on the left in the figure are arranged in different metallization planes than those connected to the middle via contact $DK_m$. Both conductive structures overlap each other and form a first capacitor C. Likewise, the conductive structures overlap the conductive structures connected to the middle $DK_m$ and the right via contact DK2 and form another capacitor C'. The middle via contact $DK_m$ and the contact surface KF1 assigned to it are provided for the ground connection, while the outer conductive contacts are connected to the electrical terminals 1 and 2, which should each be protected against overvoltages and electromagnetic pulses.

The resistor R is arranged as a conductive resistive layer WS on the surface of the second tension layer S2 in such a way that it connects the two contact surfaces KF2 and KF2' to each other with high impedance. Above the resistive layer WS there is a passivation layer P, which forms the uppermost layer of the ceramic component.

The component shown in FIG. 3 can be realized, for example, with typical dimensions of 1×1×0.5 mm. For the tension layers, glass ceramic layers can be used, while the functional layer F is realized from a varistor ceramic. For this purpose, strontium titanate, silicon carbide, and other varistor materials can be used with bismuth or praseodymium-doped zinc oxides. The passivation layer P can be made from a layer thickness or a CVD oxide or another comparable dielectric thin-film material.

Figure 4A:
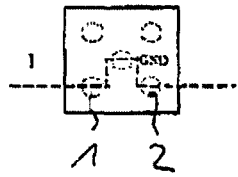
Figure 4B:
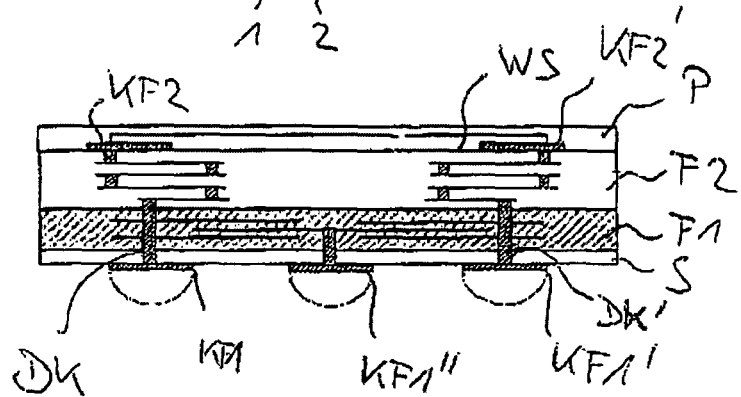
Figure 4C:
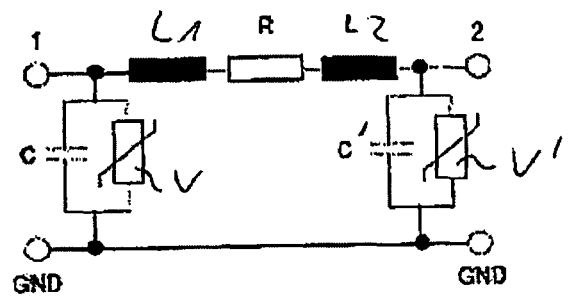

FIG. 4 shows another embodiment of the invention, which can be similarly used as an ESD/EMI protective filter. FIG. 4c shows the equivalent circuit diagram of such a filter in which two terminals 1 and 2 to be protected are bridged by the series circuit of a first inductor L1, a resistor R and a second inductor L2. Between the first terminal and the first inductor, a transverse branch to ground is connected made up of the parallel circuit of a capacitor C and a varistor V. Between the second inductor L2 and the second terminal 2, another parallel branch is connected to ground comprising the parallel circuit of another capacitor C' and a varistor V'. The C elements here each represent only the parasitic capacitance of the varistor electrodes. The named filter is designed particularly as protection against rapidly rising and therefore high-frequency interference, which is harmlessly compensated via the inductors L. High voltages appearing on the terminals 1 or 2 are harmlessly discharged to ground via the low-impedance varistors at high voltages.

FIG. 4a shows the bottom side of the component, on which the terminals are arranged as contact surfaces KF provided with solder bumps LK.

FIG. 4b shows the component in schematic cross section. In contrast to the component shown in FIG. 3, here, in the multi-layer structure, after the first functional layer F1, another second functional layer F2, in which the inductors L1 and L2 are realized, is in turn provided as the varistor ceramic material layer with a structure similar to that in FIG. 3b. This second functional layer F2 is made advantageously from a material with high susceptibility, for example, a ferrite. Also, in the second functional layer F2 there are several metallization layers, in each of which a winding or a half-winding of a coil is realized in the form of conductive structures LS. Each winding is connected by means of a via contact DK- to the winding above or to the conductive structures of this metallization plane realizing the winding. In FIG. 4b, for the second functional layer F2 four metallization planes are shown, which thus form four windings of each inductor.

A first via contact DK connects a first contact surface KF1 arranged on the bottom side of the component through the first functional layer F1 to the lowermost metallization plane of the second functional layer F2. The uppermost metallization plane of the second functional layer F2 is connected by means of via contacts to contact surfaces KF2 or KF2' arranged on the top side of the second functional layer. The two upper contact surfaces KF2, KF2' are in turn connected by means of a resistive layer WS, which realizes the high-impedance resistor R. By means of the resistive layer WS, as the uppermost layer, a passivation layer P is arranged.

The ceramic components according to the invention, which are constructed, for example, according to FIG. 3 or 4, can be manufactured with high precision and with minimal lateral distortion. Only in this way is a sufficiently precise relative adjustment of conductive structures realized in different ceramic green films and via contacts possible and thus also an interference-free operation of the component.

FIG. 5 shows, with reference to schematic cross sections, different processing steps for the manufacture of the multi-layer structure for a ceramic component according to the invention. In the first step, the corresponding green films are manufactured, wherein different known film casting and drawing processes can be used. The functional films F contain particles of the desired functional ceramics in a binder. Advantageously, an average particle diameter is set in the µm range. In contrast, the tension layers S contain the components of a recrystallizing material, for example, a glass ceramic, particularly in the form of suitable oxides of the glass ceramic components.

The particles of the tension layers S are also distributed homogeneously in a binder, wherein particle diameters in the µm range are preferred. In addition, the tension layers contain crystalline mineral particles, which can be used as crystallization seeds for the glass ceramic in the recrystallization process. Advantageously, the glass components are mixed with the crystalline particles in a weight ratio between 2:1 and 1:2. An example glass ceramic composition comprises four [components] each in weight percent 54% SiO2, 17% PbO, 7.4% CaO, 6.6% $Al_2O_3$, 6% $B_2O_3$, 3.2% MgO, 3% $Na_2O$.

In the next step, holes are generated in the green films for the via contacts DK, for example, through punching. Then the via contacts are filled with a conductive material, for example, a paste filled with conductive particles. As the conductive particles, metallic grains or whiskers of the systems Ag, AgPd, AgPt, Pd, Pt are suitable. The filling of the via contacts can be realized, for example, with a doctor blade above a template or by means of screen printing.

In the next step, conductive structures LS are deposited on the green films, for example, by printing a conductive paste, advantageously of the same system, with a suitable technology, for example, by means of screen printing. FIG. 5 shows different green films provided for a multi-layer structure according to the invention. In the figure, two green films GS1 and GS2 are provided for a first and a second tension layer. For the functional layer, here three green films GF1 to GF3 are shown. In practice, however, the multi-layer structure usually consists of a greater number of green films with functional ceramic material, in order to realize within the functional layer a corresponding number of metallization planes with conductive structures formed in these planes.

Figure 5A:
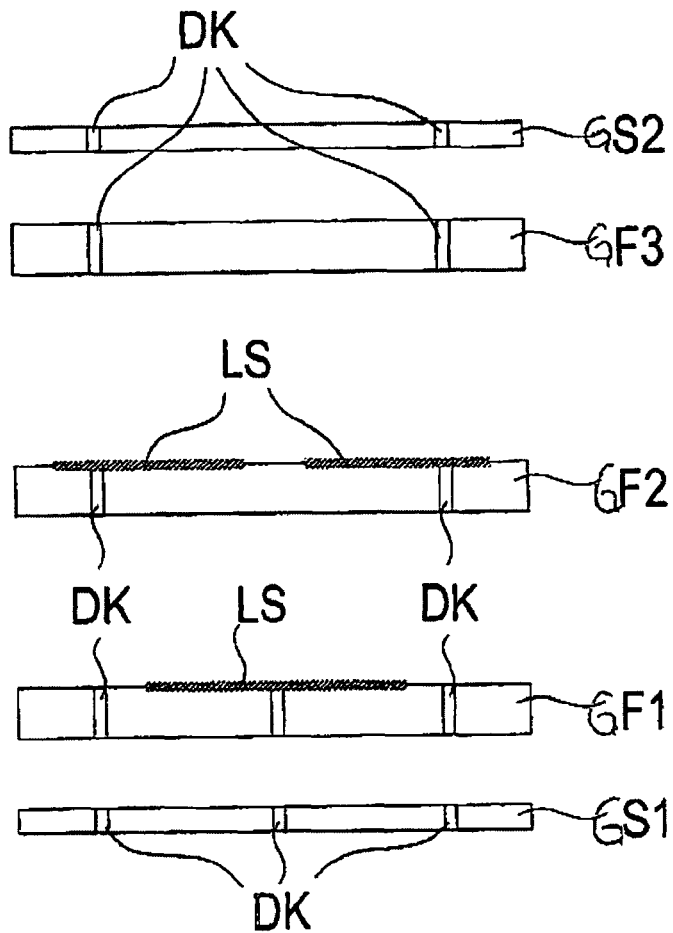
Figure 5B:
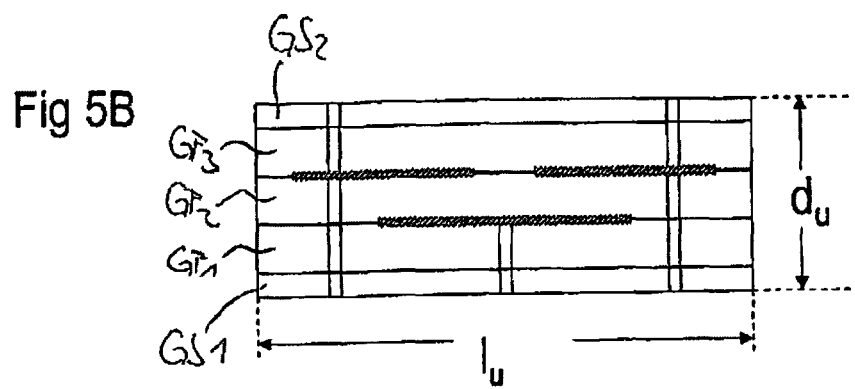

In the next step, the green films GS and GF are stacked one above the other and compacted together in the sequence shown in FIG. 5a. FIG. 5b shows the compacted film stack in schematic cross section.

A temperature program is then performed, in which in the first step a debinding process takes place on the green film, in that the binder material is transitioned in an oxidizing mainly into gaseous, volatile products. Without prior cooling, the recrystallization process of the tension layer S can follow this debinding process.

For example, the stacked and compacted green films are heated in several steps to a maximum debinding temperature of ca. 450°. For this purpose, they are heated, for example, at 5 K per minute to 1000 Celsius and at 0.2 K to 0.5 K per minute to 450° C. The recrystallization of the tension layer, which is performed in the selected embodiments at, e.g., 880° Celsius, can directly follow debinding. For this process, heating is performed at a rate of ca. 5 K to 10 K per minute to this first recrystallization temperature and held at this temperature for ca. 15 to 60 min. Then the layer structure, which now comprises a recrystallized tension layer, can be cooled back to room temperature.

In the next step, the second sintering for the compaction and sintering of the functional ceramic is performed. The heating profile for this sintering is selected according to the desired ceramics and equals, in the embodiment, with the varistor ceramic, for example, heating at a rate of 1 K to 4 K per minute to ca. 1000° to 1100° C. It is held at this temperature for ca. 180 to 240 min and then cooled at a cooling rate of −1 K to −4 K to room temperature.

However, it is also possible to heat directly to the second sintering temperature after the recrystallization of the tension layer without prior cooling.

Figure 5C:
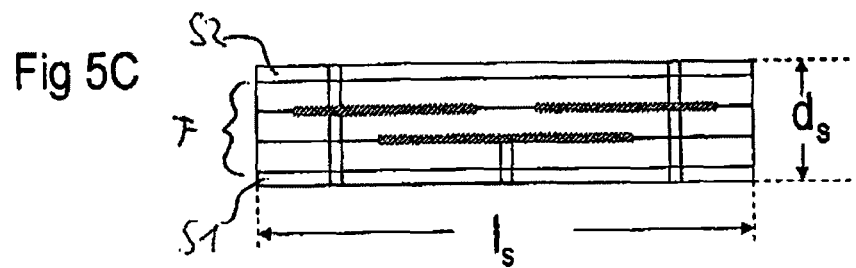

As a result, the monolithic ceramic body with a multi-layer structure shown in FIG. 5c is obtained. Compared with FIG. 5b, which represents the stack of green films compacted together, due to the debinding and compaction, the sintering shrinkage leads to a reduction in the thickness of the stack from a value $d_u$ for the green film stack of FIG. 5b to a thickness $d_s$, reduced by ca. 50% in the sintered state according to FIG. 5c. The tensioning effect that the tension layer exerts on the layer structure during the second sintering process produces practically no changes in the lateral dimensions, so that corresponding lateral diameters l remain nearly unchanged. The length $l_s$ of the sintered multi-layer structure according to FIG. 5c is less than the length $l_u$ of the unsintered film stack of FIG. 5b by a maximum degree of ca. 2%.

Figure 5D:
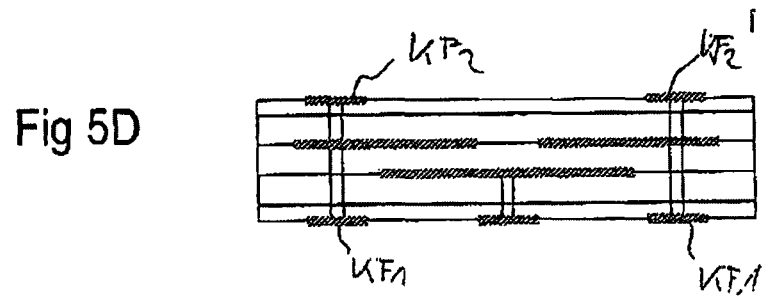
Figure 5E:
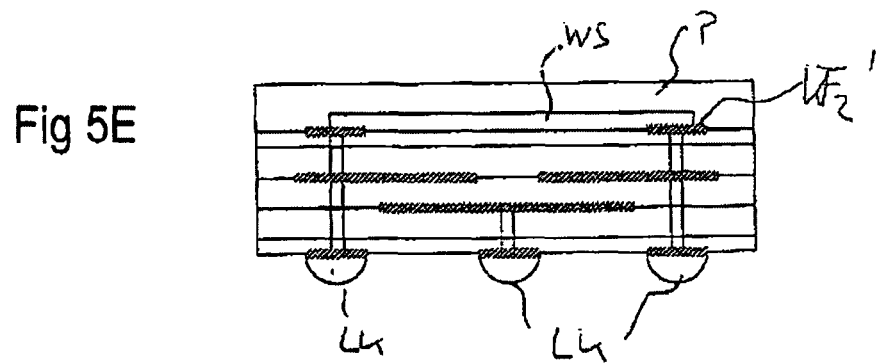

In the next step, electrical contact surfaces or conductive structures are deposited on the top and bottom sides of the multi-layer structure, for example, similarly again in the form of printed screen printing pastes, which are baked in a third sintering process. FIG. 5d shows the multi-layer structure with lower contact surfaces KF1 and upper contact surfaces KF2.

In the next step, a resistive layer WS is in turn generated, for example, by printing and baking a resistive material. This include high-impedance but conductive particles, for example, particles made from ruthenium oxide $RuO_2$, bismuth ruthenium oxide $Bi_2Ru_2O_7$, made from carbon, titanium nitride, $Ti_2N$, $LaB_6$, $WO_2$, $Al_2O_3$, or also different lead-oxide compounds. Then a passivation layer is generated, which is also printed or deposited with any other method, in particular, a thin-film method. A printed passivation layer is baked. Then the lower contact surfaces KF1 are provided with solder bumps LK, which allow simple soldering of the component.

At the stage of FIG. 5d, for example, it is possible to use the monolithic ceramic multi-layer structure as a substrate material for discrete or integrated electric and electronic components. Accordingly, a discrete or integrated component can be mounted on at least one surface of the multi-layer structure and electrically connected to the contact surfaces KF. Possibilities of arrangement are provided in flip-chip or SMD designs. It is also possible to bond the other corresponding component and to form a contact with the contact surfaces KF by means of bonding wires. In this way, additional interconnection with component functions is possible that cannot be realized or not well realized in the ceramic multi-layer structure.

In another construction, a structured multi-layer structure can be generated, in that green films of different surface area are used. In this way, stepped multi-layer superstructures can be obtained, wherein space for the arrangement of discrete or integrated components can be provided on the stepped surfaces. Instead of a stepped structure, it is also possible, before the stack, to already provide a part of the, e.g., upper green films with a correspondingly spacious recess, which represents a cavity that is open at the top in the finished, sintered monolithic multi-layer structure. A discrete component can also be introduced into such a cavity in a space-saving manner and can be electrically connected to the monolithic component according to the invention.

The invention is not limited to the structures shown in the embodiment examples. Instead, ceramic components according to the invention can be realized with an arbitrary number of metallization planes and an arbitrary construction of the conductive structures, which are arranged in these planes and which remain separated from each other also galvanically according to the component function. In addition to the component shown in FIG. 4 with two different functional layers, other different functional layers can also be integrated in the component, each connected to the function realized in the component. In all cases, it is possible to realize components with minimal lateral shrinkage during the sintering. In addition, it is possible to use a material with low dielectric constant for the tension layer and to construct conductive structures separated from each other by the tension layer in the component and contact surfaces with low parasitic capacitance. In addition, it is possible to use via contacts for forming inductors that have an inductance corresponding to their total length.

The manufacture of components according to the invention was shown in FIG. 5 only with reference to the structures required for a single component. Obviously, green films with larger surface areas, on which the structures for a plurality of ceramic components can be produced in parallel, are also used. Separation of these components can then be performed, for example, on the basis of the compacted stack of green films. It is also possible to separate the components only after a first or second sintering process, said method requiring less effort. If the ceramic components are used as carrier substrates for different, additional components, then it is advantageous to perform the placement of these additional components before the separation of the ceramic components.

The invention claimed is:

1. A monolithic sintered component with monolithic multi-layer structure, comprising:
    a functional layer comprising a functional ceramic,
    a tension layer comprising a dielectric material directly adjacent to the functional layer in the multi-layer structure, the tension layer including a plurality of crystalline domains disposed in a matrix, the matrix including a recrystallized material,
    a first metallization plane and a second metallization plane, the functional layer being between the first metallization plane and the second metallization plane,
    electrically conductive structures, which form a component function together with the functional layer, in the first and second metallization planes, and
    wherein the functional ceramic has a sintering temperature which lies above a phase-change temperature of the dielectric material.

2. The monolithic sintered component of claim 1, wherein the functional layer comprises several metallization planes with electrically conductive structures.

3. The monolithic sintered component of claim 2, wherein the multi-layer structure comprises solderable electrical contact surfaces including via contacts on a bottom side of the multi-layer structure, the via contacts being configured to electrically connect the solderable electrical contacts to the electrically conductive structures in the interior or on the surface of the multi-layer structure.

4. The monolithic sintered component of claim 1, wherein the recrystallized material comprises a glass ceramic.

5. The monolithic sintered component of claim 4, wherein the tension layer comprises a glass ceramic made from alkali borosilicate, alumoborosilicate, alumosilicate, lanthanum borate titanate, or alkaline earth lanthanum borate.

6. The monolithic sintered component of claim 1, wherein the component function includes a function of a component type selected from the group consisting of a resistor, a capacitor, an inductor, a varistor, and a thermistor, and
    the functional ceramic is selected based on the component type from a group of materials consisting of a resistor material, a capacitor ceramic, a ferrite, a varistor material, and PTC or NTC ceramic.

7. The monolithic sintered component of claim 6, further comprising a discrete electrical component mounted on a surface of the film stack and electrically connected to the component.

8. The monolithic sintered component of claim 1, wherein the phase-change or recrystallization temperature of the dielectric material is at least 50 kelvin less than the sintering temperature of the functional ceramic.

9. The monolithic sintered component of claim 1, further comprising a plurality of tension layers, and
    wherein functional layer and the plurality of tension layers are arranged in an alternating sequence.

10. The monolithic sintered component of claim 9, wherein the multi-layer structure is symmetrical in the stack direction with respect to the layer sequence and layer thicknesses.

11. The monolithic sintered component of claim 1, wherein a thickness of the tension layer is between 15 and 300 μm.

12. The monolithic sintered component of claim 1, wherein the multi-layer structure further comprises additional layers or comprises multiple functional layers.

13. The monolithic sintered component of claim 1, wherein the crystalline domains are insulated phases that include a material selected from the group consisting of $Al_2O_3$, $TiO_2$, and $ZrO_2$.

14. The monolithic sintered component of claim 1, wherein the functional ceramic has a sintering temperature above 950° C.

15. The monolithic sintered component of claim 1, wherein:
    the functional layer comprises a green film;
    the tension layer comprises a green film; and
    the green film for the tension layer has a phase-change temperature below a sintering temperature of the functional ceramic and at which the green film transitions into a recrystallized phase that remains in a solid phase above the sintering temperature of the functional ceramic.

16. The monolithic sintered component of claim 1, wherein the crystalline domains include a mineral oxide.

17. The monolithic sintered component of claim 1, wherein the functional ceramic has a sintering temperature greater than or equal to about 1000° C.

18. The monolithic sintered component of claim 1, wherein the tension layer has a thickness sufficient to tension the functional layer during sintering of the functional layer.

* * * * *